United States Patent
Farmer et al.

(12) 
(10) Patent No.: US 6,587,012 B1
(45) Date of Patent: Jul. 1, 2003

(54) AUTOMATIC SLOPE AND GAIN (ASG) DETECTOR TECHNIQUE INCLUDING A PILOT SIGNAL

(75) Inventors: James Farmer, Lilburn, GA (US); John J. Kenny, Norcross, GA (US); John S. Hollabaugh, El Paso, TX (US); Calvin W. Stover, El Paso, TX (US)

(73) Assignee: ARRIS International, Inc., Duluth, GA (US)

( * ) Notice: Subject to any disclaimer, the term of this patent is extended or adjusted under 35 U.S.C. 154(b) by 0 days.

(21) Appl. No.: 09/677,168

(22) Filed: Oct. 2, 2000

Related U.S. Application Data
(60) Provisional application No. 60/157,361, filed on Oct. 1, 1999.

(51) Int. Cl.[7] .............................................. H04B 3/10
(52) U.S. Cl. ........................ 333/15; 333/16; 327/65; 455/500; 455/68
(58) Field of Search ................. 333/15, 16; 327/65; 455/500, 68

(56) References Cited

U.S. PATENT DOCUMENTS

| | | | | |
|---|---|---|---|---|
| 3,781,703 A | * | 12/1973 | Duty ............................ | 330/52 |
| 4,003,006 A | * | 1/1977 | Mandeville et al. ........... | 333/16 |
| 5,390,348 A | * | 2/1995 | Magin et al. .................. | 455/63 |
| 6,351,631 B1 | * | 2/2002 | Noeske et al. ............... | 455/260 |
| 6,430,200 B1 | * | 8/2002 | Han et al. .................... | 370/500 |

FOREIGN PATENT DOCUMENTS

JP          5-102872     *  4/1993

* cited by examiner

*Primary Examiner*—Barbara Summons (57) ABSTRACT

An apparatus (7) for switching from a first pilot signal and a second pilot signal on a system transporting a plurality of signals. A tuner (30) receives the signals and provides an output signal to a loop compensation circuit (26). The tuner includes a bandpass filter (22) for removing signals other than the selected pilot signal from the output of the tuner. The output of the bandpass filter is provided to a detector circuit (24, 25). The output of the detector is compared with a reference signal (28) by the loop compensation circuit (28). A microcontroller (39) sends a tuning command to the tuner which causes the tuner to switch from tuning to the first pilot signal to tuning to the second pilot signal and also sends a new reference voltage to the loop compensation circuit. Thus, if the input signal changes from analog to digital modulation on the pilot channel, the set-point, or target level of the reference signal, will automatically change to provide the correct value for operation of the circuit. The microcontroller may change the selected pilot signal based upon a command in the input signal or upon an operator command, such as by setting a switch (not shown).

15 Claims, 5 Drawing Sheets

AUTOMATIC SLOPE AND GAIN (ASG) DETECTOR TECHNIQUE INCLUDING A PILOT SIGNAL

This application claims priority from the provisional application Ser. No. 06/157,361 filed Oct. 1, 1999.

The present invention relates to methods for implementing the automatic slope and gain (ASG) control function in communications equipment, such as cable television distribution amplifier.

BACKGROUND OF THE INVENTION

Those skilled in the art know that the attenuation of radio frequency (RF) signals in coaxial cable is, to an extent, a function of the temperature of the cable. Accordingly, it has long been the practice in cable television systems to provide gain correction at certain amplifiers in a cascade, which is a "string" of amplifiers used to distribute signals to subscribers. Several methods of gain correction are used. The simplest gain correction method is known as thermal equalization. In this technique, the internal temperature of an amplifier station is sensed, for example by a thermistor, and the gain of the station is changed to approximate the change in cable loss that is assumed to result due to changes in ambient temperature, as represented by the change of temperature inside the amplifier. This technique is low in cost, but provides only for approximate compensation.

A more sophisticated method of controlling the amplifier gain involves sensing a signal level and adjusting the gain of the amplifier ahead of the sensing point to bring the level back to a standard, or expected, level. This is called an automatic gain control (AGC) system. The present invention is applicable to AGC systems, but present practice adds yet another level of sophistication called ASG. In ASG systems, it is recognized that the variation of attenuation with temperature exhibited by the coaxial cable is also a function of frequency. Accordingly, it is the practice to not only adjust the gain of the amplifier station according to the sensed signal level, but to adjust the gain vs. frequency characteristic ("slope") of the station according to the sensed signal level.

Because the entire spectrum of signals on the cable is very wide (downstream transmissions in North America presently use frequencies from 54 to about 870 MHz.), it is common practice to sense only the level of one signal, called the "pilot" signal. Previous systems employed two pilot signals, one at the low end of the spectrum and one at the high end. Such systems were called dual pilot systems, but they are not common today due to reduced cascade lengths which resulted from employment of fiber optic transmission.

Figure 1:
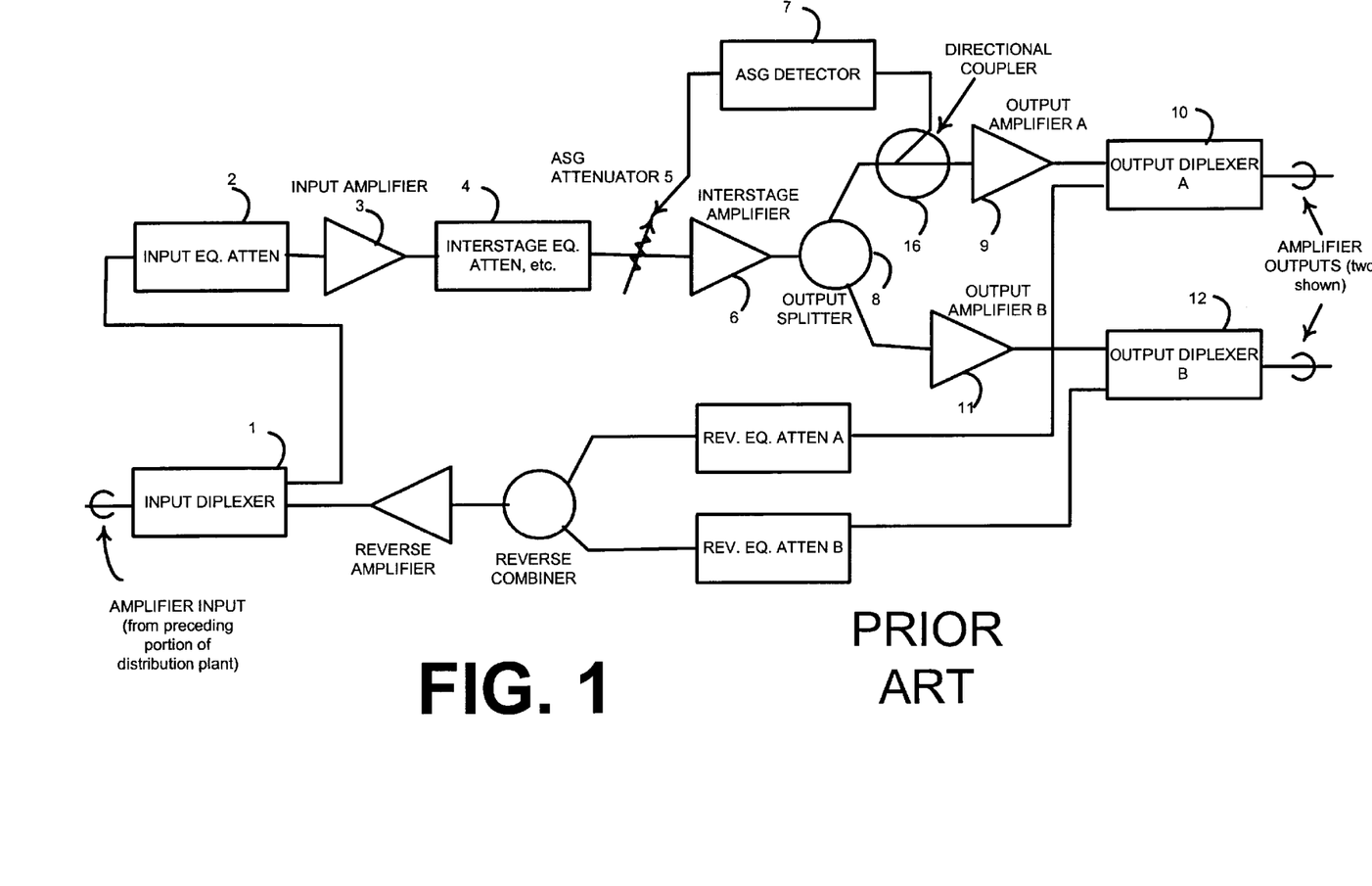
FIG. 1 is a block diagram of an amplifier station as they exist in the prior art.

FIG. 1 is a block diagram of an amplifier station as they exist in the prior art. FIG. 1 shows an input path for the incoming signal to the amplifier input. This signal is received by input diplexer 1. Input diplexer 1 separates the signal into downstream (generally higher frequency) signals and reverse (usually lower frequency) signals. The reverse section of the amplifier usually does not employ ASG, but is merely shown for illustrative and complete diagram purposes, as will be appreciated by those skilled in the art. The remainder of this discussion will concentrate on the downstream path, shown at the top of the FIG. 1.

Downstream signals from input diplexer 1 are applied to input equalizer and attenuator 2, used for equalization of the signal. From the output of the input equalizer and attenuator 2, the signal is received by input amplifier 3. The input amplifier 3 is used to amplify the signal before downstream processing. The output of the input amplifier 3 is received by the interstage equalizer and attenuator 4. The interstage equalizer and attenuator 4 is used, as required, to shape the static response of the amplifier station and its output is received by ASG attenuator 5. The ASG attenuator 5 is used to apply the proper attenuation to the signal in accordance with its coordinating interstage amplifier 6 circuit. As explained above, the real circuit is usually more complex than just an attenuator. The real circuit usually includes components that shape the response such that there is more change in attenuation at high frequencies than at low frequencies. This is not shown here for clarity, but is well known by those skilled in the art.

Thus, from the attenuator 5, the signal is applied to a second amplifier stage, interstage amplifier 6 for further amplification in accordance with the needs of the pilot signal level. From interstage amplifier 6, the signal is sent to output splitter 8, which divides the signal into two different output paths. One path allows the signal to be applied, to a directional coupler 16, which takes a sample of the signal to the ASG detector 7. The ASG detector 7 detects the level of the pilot signal. The output of ASG detector 7 is a control signal which adjusts the attenuation of attenuator 5 such that the level of the pilot signal as measured by ASG detector 7 remains constant, regardless of the level of the incoming signal, within reasonable limits.

The pilot signal, having received correction, is directed by the directional coupler 16. The signal comes from directional coupler 16 and is applied to output amplifier A 9. The output of output amplifier A 9 is then received by output diplexer A 10. The diplexer having an input from the output amplifier A 9, and a reverse flow path to the reverse channel.

The path, yet to be discussed, from output splitter 8 goes through output amplifier B 11. From output amplifier B 11, the signal is received by output diplexer B 12. The output diplexer B 12, as does output diplexer A 10, separates the downstream and reverse signals as explained above.

Other amplifiers may have fewer or more outputs, and fewer or more amplification stages. Other variations on the architecture are well known to those skilled in the art. This block diagram is presented by way of example and not as a limitation to the applicability of the present invention.

Figure 2:
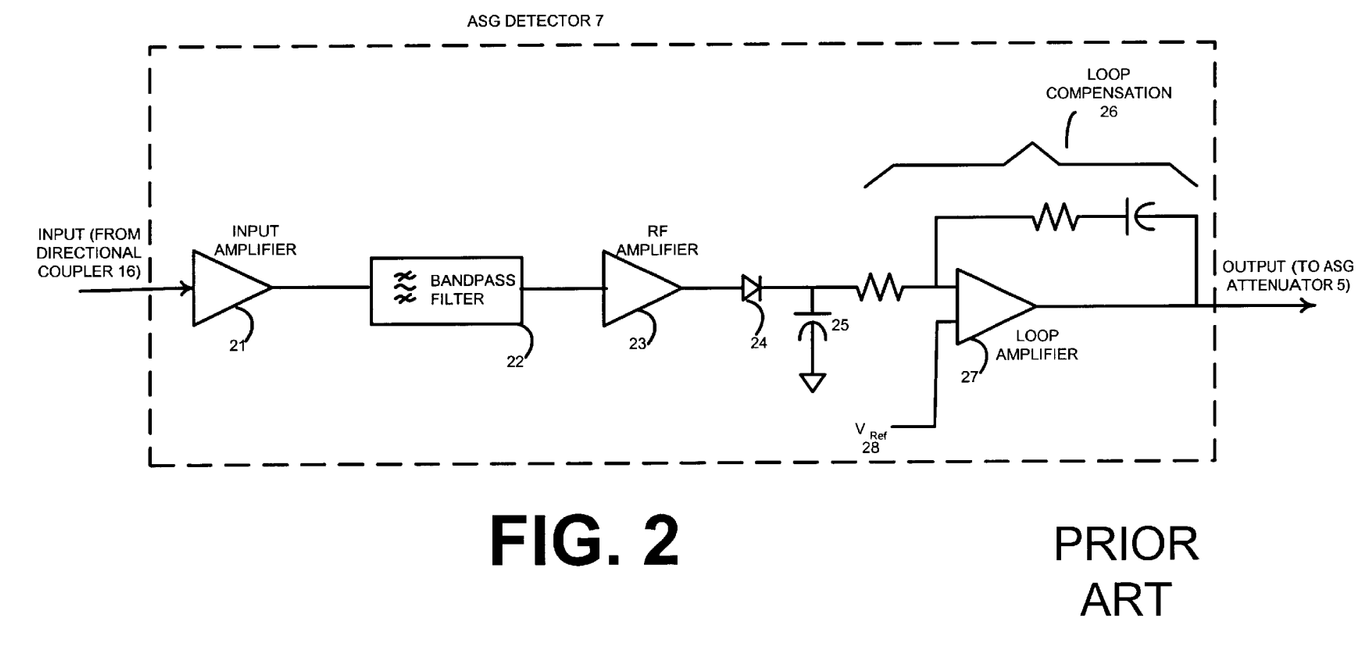
FIG. 2 is a diagram showing an ASG detector known in the prior art.

FIG. 2 is a diagram showing an ASG detector known in the prior art. Note, signal flow in FIG. 2 is from left to right, while in the ASG detector 7 of FIG. 1, the signal flow is in the opposite direction. Signal input from directional coupler 16 (also see FIG. 1) is supplied to an input amplifier 21, used to amplify the input signal. The signal comes from the input amplifier 21 and is received by a bandpass filter 22, which selects the one signal that is to be used as the pilot from the plurality of carriers on the cable. As is well known in the art, the bandpass filter has a upper and lower limit of frequencies it will pass, forming an output referred to as passband of frequencies, or simply passband signal. After filtering, the signal may be amplified again, if necessary, by RF amplifier 23 the output of RF amplifier 23, is received by or detected by detector diode 24 and filter 25. The voltage on filter 25 is proportional to the level of the pilot carrier. Filter 25 also serves to pass the AC component from the detector circuit to a reference (ground). The voltage across filter 25, is compared with a reference voltage $V_{Ref}$ 28 by loop amplifier 27. The feedback loop of this comparator circuit, the loop compensation 26, helps determine the dynamic response of the ASG loop, as is well understood by those skilled in the art. The output of loop amplifier 27 is supplied to ASG attenuator 5 (see FIG. 1) to control its attenuation. Thus, the ASG detector 7 and the attenuator 5 work to ensure that the level of the pilot signal remains constant at the output of the amplifier station of FIG. 1.

According to the teachings of the present state of the art, the ASG detectors utilize a circuit similar to that shown in FIG. 1. After the signal progresses through the input equalizer, amplifiers, and attenuators, the signal reaches the ASG detector. The prior state of the art teaches an ASG detector as shown in FIG. 2.

The system shown in FIG. 2 works, but has some limitations that are overcome by the present invention. The tuning of the ASG detector is set by the bandpass filter. This filter traditionally has been built with conventional inductors and capacitors (L-C filter) and recently there has been success at using surface acoustic wave (SAW) filters. However, with both of these technologies there are some limitations. With L-C filters, the first limitation is that it is difficult to design a filter that is narrow enough to preclude all except the one desired pilot carrier from reaching the detector. The typical frequencies used for pilot carriers today tend to range from about 450 MHz to about 650 MHz. In the architecture of FIG. 2, it is very difficult to design an L-C filter at these frequencies that is narrow enough to exclude signals located on adjacent channels, 6 MHz removed from the desired channel. This means that if the adjacent channel carriers are removed from the distribution spectrum for any reason, the operating point of the ASG system will change, possibly causing excessive distortion to be introduced into the plant. SAW filters can be realized with sufficiently narrow bandwidths such that this is not a problem.

A second limitation is that once a cable operator has chosen a pilot carrier frequency and has deployed equipment according to that selection, he is precluded from changing to a new pilot carrier. This has not been a major problem in the past, but does constrain an operator who may decide that another frequency would yield more satisfactory performance. A related and more serious problem, however, exists for the manufacturer of the equipment. Since different customers desire to use different pilot carrier frequencies, the manufacturer must design and build ASG detector circuits with different filters, tuned for different frequencies. When L-C filters are used, this is practical, although it creates continuing problems when a customer orders a frequency that is not in stock. When SAW filters are used, though, creating an ASG detector at a different frequency means paying non-recurring engineering charges to an outside firm to develop a new filter, then stocking different filters. It is common in manufacturing situations to get an order for a pilot frequency other than that provided by the SAW filters in stock and to have to order them. This can add weeks to delivery cycles, and increase costs for the manufacturer, as well as inconveniencing the cable operator customer.

Yet another limitation of the present art is that some day the cable industry likely will change the signal on the pilot frequency from analog modulation to digital modulation. Today, it is the traditional practice of cable systems to carry television signals in analog format, with a picture carrier located 1.25 MHz above the lower channel boundary, a color carrier located 3.58 MHz (for the NTSC television system used in North America) higher than the picture carrier, and a sound carrier located 4.5 MHz above the picture carrier. Today all pilot carriers we are aware of are utilizing this kind of analog modulation. The optimum design of the ASG detector is to center the bandpass filter on the picture carrier of the pilot channel.

However, the industry has begun transmitting some signals using digital modulation, which occupies the channel in a much different manner. The tuning of a bandpass filter for analog signals is no longer optimum if the analog-modulated pilot signal is replaced by a digital-modulated pilot signal. Furthermore, it is current practice to set the level of the digital signal significantly lower than the level of the analog-modulated signal, particularly as read by the detector. This means that if the analog pilot signal is replaced with a digital signal, the ASG operating point would shift drastically, thereby causing incorrect operation of the amplifier. Therefore, it is and will be increasingly necessary to have a reception method that corresponds to the signals transmitted. The reception method being 1) setting the reference level, and 2) tuning to a specific frequency.

At the present time, the cable television industry is not immediately planning to replace analog signals at the pilot frequency with digital signals, but it is inevitable that this will occur in the future. It is desirable to take action when upgrading the plant now, which will ease the operational burden of modifying the ASG circuits for digital modulation when analog signal at the pilot frequency are replaced with digital signals.

Figure 3:
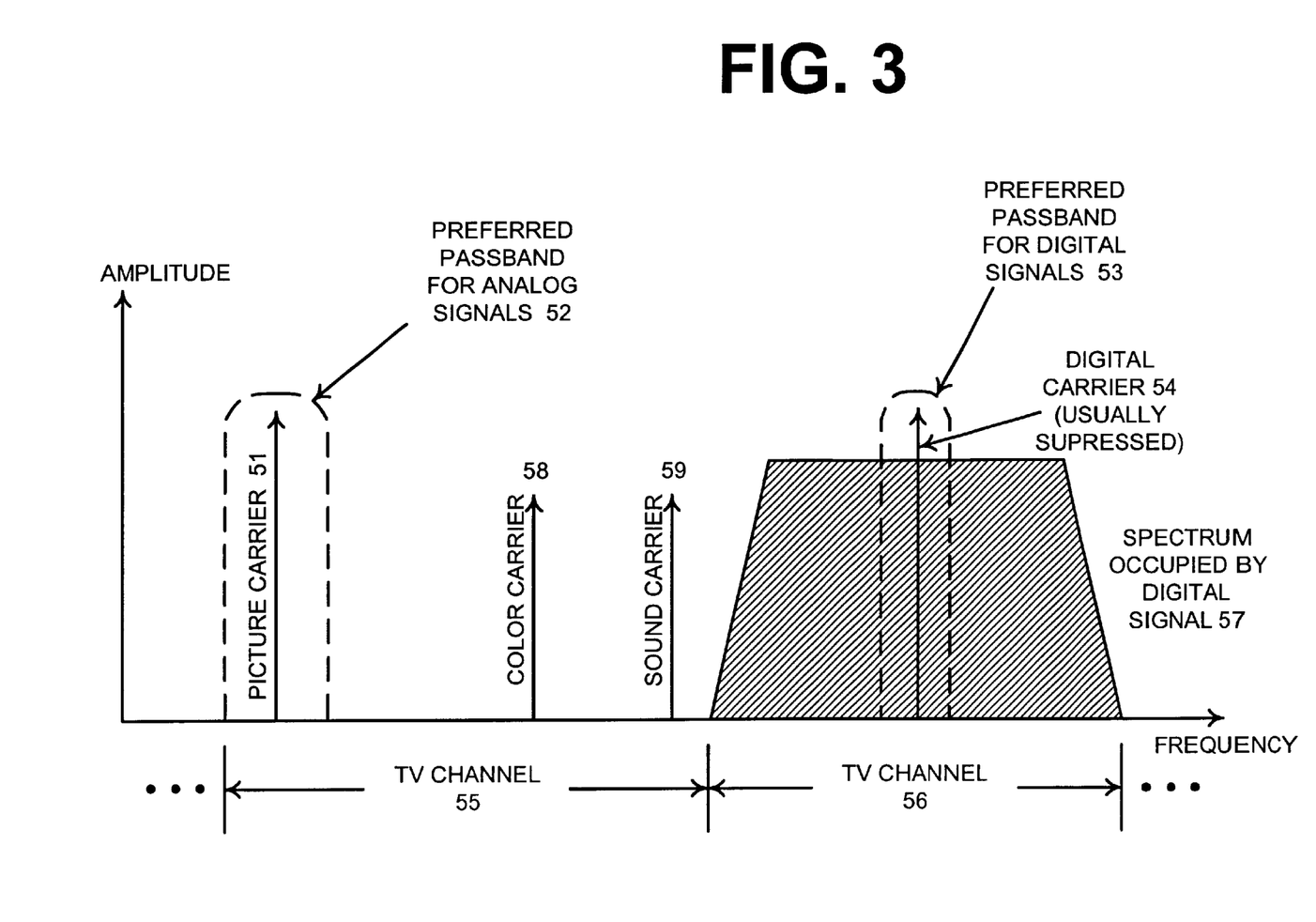
FIG. 3 is a conventional spectrum plot showing two TV channels modulated with an analog signal and digital signal, respectively.

FIG. 3 shows the difference between analog-modulated and digital-modulated carriers. FIG. 3 is a conventional spectrum plot of two TV channels. The lower TV channel 55 is modulated with an analog signal, and the higher channel 56 is modulated with a digital signal. The analog channel is characterized by a picture carrier 51, a color carrier 58, and a sound carrier 59. The preferred ASG detector passband 52 for the analog signals is centered on the picture carrier as shown. Using a SAW filter 22 (FIG. 2.), this desirable passband shape can be approximated rather well. When using an L-C filter, the passband is wider.

Shown to the right of the analog-modulated channel in FIG. 3 is TV channel 56, which is carrying a digital-modulated carrier. The spectrum of a digital channel 57 is much different. The spectrum 57 is occupied over most of the channel by a signal that has a constant power for every unit of bandwidth. The passband 53 of the ASG system is near the center of the channel, because as one approaches the channel edge, the energy density is no longer constant. The digital carrier 54 (usually suppressed) is shown approximately centered in the spectrum 57. The difference in the modulation methods may be readily observed. Thus, when the respective pilot signals are changed, the need for the present invention becomes apparent to one skilled in the art.

Furthermore, the signal level of the digital signal is intentionally set lower than that of the analog signal to reduce the loading on the distribution plant. Typically, 64 QAM modulated signals are set about 10 dB lower than the analog signals, and 256 QAM signals might be set 6 dB lower. These numbers could change in the future.

Because the desirable passband for the ASG detector is narrow compared with the occupied bandwidth, a detector will have to detect even lower amounts of energy. Those skilled in the art know that the majority of the energy in an analog signal is concentrated in the picture carrier. As a practical matter, if one uses a filter having a passband 300 KHz wide, one will successfully detect the peak amplitude of the analog signal. However, if one uses this filter for a digital signal having a total bandwidth of 5 MHz, those skilled in the art know that the power reaching the detector will be further reduced by $$10 \log \frac{5000}{300} = 12.2 \text{ dB}.$$

Thus, the digital signal is intentionally set 6–10 dB lower than the analog signal it replaces, and the ideal detector will experience a further reduction of the detected signal level by 12.2 dB. Clearly, where it is desired to keep the output within ±1 dB of the desired level, some sort of accommodation must be made if the pilot carrier modulation is changed from analog to digital.

Furthermore, suppose that the pilot is converted to a digital signal, but the adjacent channel continues to carry an analog signal, which is a likely scenario during conversion from analog to digital. The higher analog signal on the adjacent channel would require the performance of a filter to be even better. It would be desirable if, at the time of conversion of the pilot channel from analog to digital, a signal could be sent from the headend that would automatically retune the detector from the analog picture carrier to the approximate center of the channel, and would also change the ASG set-point, determined by a reference voltage, to that appropriate for the digital signal. The reverse could be accomplished in a like manner, were the less likely change made from a digital-modulated channel to an analog modulated channel.

Finally, while present ASG circuits are reasonably effective, they have limitations in how accurately they can hold the output signal level as a result of temperature changes in their own circuitry. Input amplifiers, RF amplifiers, filters, and detectors all exhibit some variations in gain with temperature. These variations represent errors in the output signal level that cannot be corrected by the ASG system. While it is possible to include temperature compensation in the system, the practical amount of correction is somewhat limited.

SUMMARY OF THE INVENTION

The present invention overcomes the above described problems by utilizing a circuit, and a method to allow flexibility in the changing carrier frequencies that may be used in a coaxial cable feed for ASG sensing;, with minimum disruption during the changing of that carrier frequency.

The present invention includes using an agile tuner to select the frequency that is used for ASG sensing (the "pilot signal"), thereby allowing a cable operator to change the pilot carrier frequency from time to time. This is useful if the reference pilot carrier frequency is changed or if the chosen pilot carrier is changed from analog to digital at some point in the future. It also provides manufacturing efficiency in that the manufacturer is not required to stock multiple filters for different pilot frequencies. A second aspect of the present invention includes shifting the signal detector set-point such that if the pilot carrier is changed from having an analog carrier to having digital modulation, the amplifier's operating point can be changed without having to physically visit the site. A further aspect of the present invention includes using a micro-controller (low end microprocessor) to control the set-point of the amplitude detection circuit. This aspect can then be expanded to provide useful improved thermal compensation and low cost dual slope AGC, such as by using a microcontroller to improve the performance of a thermal equalizer, which is used where an ASG circuit is not used. The microcontroller can be used to improve temperature compensation of the ASG circuit itself.

DETAILED DESCRIPTION

Figure 4:
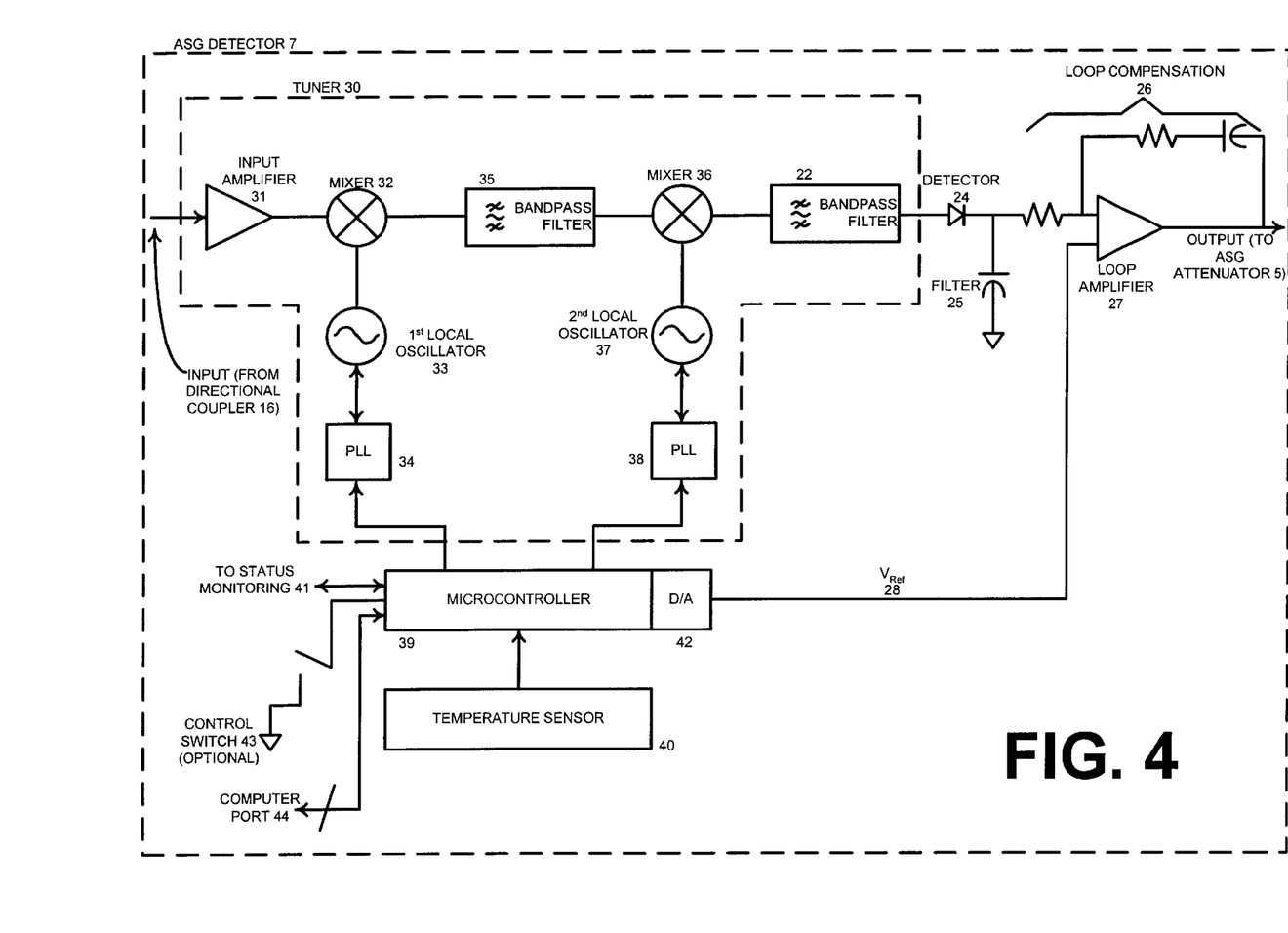
FIG. 4 is a diagram showing an ASG detector, in accordance with the present invention.

FIG. 4 illustrates one aspect of the present invention, which is a change to the architecture of the ASG detector 7 and replaces the circuitry of the ASG detector 7 (FIG. 2), but the remainder of the amplifier station shown in FIG. 1 remains unchanged. As shown in FIG. 4, a signal enters at the left and is amplified in input amplifier 31. After input amplification, the signal enters a tuner circuit 30. The tuner circuit 30 shown is a dual conversion tuner, but a single conversion tuner can also be used. The microcontroller 39 sends the tuner signal to the phase-locked loop (PLL) 34 and associated $1^{st}$ local oscillator 33. The $1^{st}$ local oscillator 33 is shown separate from the phase-locked loop 34 for clarity reasons only, since they together perform a function of creating a stable frequency, first adjustable frequency signal. The first adjustable frequency output from the phase-locked loop (PLL) 34 and $1^{st}$ oscillator 33 is the input for the mixer 32. The mixer 32 also receives the output of input amplifier 31, the pilot signal. In the dual conversion tuner, the signal to be used as the pilot is converted to a first intermediate frequency by mixer 32 and first local oscillator 33. The first intermediate frequency signal is the input to bandpass filter 35. The first intermediate frequency is filtered in bandpass filter 35, resulting in a first passband signal. The passband signal excludes those signals not within the lower and upper limits of the bandpass filter 35. Thus, the first passband signal is provided to a second mixer, mixer 36.

In addition, the microcontroller 39 sends a second tuner signal to phase-locked loop (PLL) 38 and $2^{nd}$ local oscillator 37. The output of phase-locked loop (PLL) 38 and $2^{nd}$ local oscillator 37 is a second adjustable frequency signal. As previously discussed, the second adjustable frequency signal is a frequency which the $2^{nd}$ local oscillator is locked into by the phase-locked loop (PLL) 38 configuration. The mixer 36, in addition to receiving the second adjustable frequency signal, the second mixer 36 receives the second intermediate frequency from bandpass filter 35. Typically the first intermediate frequency is above the band of signals to be received. An example would be 1100 MHz, though other frequencies can be used. The second intermediate frequency is a much lower frequency. A commonly used intermediate frequency for television work in North America is 45.75 MHz for the picture carrier, though other frequencies can be used.

The second bandpass filter 22 provides most of the selectivity that defines the filter shape, 52 (analog) or 53 (digital), as illustrated in FIG. 3. The function of the second bandpass filter 22 is the same as that of filter 22 of FIG. 2. The only difference between filter shapes 52 and 53 is the location of the passband within the television channel (filter 53 could be wider, but does not have to be wider). Those skilled in the art can easily appreciate that the passband can be shifted by changing the tuning of either the first local oscillator 33 or the second local oscillator 37. The local oscillator tuning can be effected by changing the information loaded into the appropriate phase-locked loop (PLL) circuit 34 or phase-locked loop (PLL) 38. Microcontroller 39 controls the loading of data into the phase-locked loop (PLL) 34 and phase-locked loop (PLL) 38. In FIG. 4, the microcontroller 39 gets its inputs from the status monitoring system 41, which is not explicitly shown but which is well known to those skilled in the art. They allow one-way or two-way communication between a headend and equipment in the field, such as the amplifier of FIG. 1.

From bandpass filter 22 the signal is passed to detector 24. As described above, in FIG. 2, the second passband signal is received by or detected by detector diode 24 and filter 25. The voltage on filter 25 is proportional to the level of the pilot carrier. Filter 25 also serves to pass the AC component from the detector circuit to a reference (ground). The voltage across filter 25, is compared with a reference voltage $V_{Ref}$ 28 by loop amplifier 27 and loop compensation 26. The feedback loop of this comparator circuit, the loop compensation 26, helps determine the dynamic response of the ASG loop, as is well understood by those skilled in the art. Thus, the remainder of the operation is identical to that described above, with one exception. It was shown above under limitations of the present art, and shown further with reference to FIG. 3, that if the operator changes from analog to digital modulation on the pilot channel, that the set-point, or target level of the pilot signal, must change. This set-point is determined by $V_{Ref}$ 28. The current state of the art does not allow for changing $V_{Ref}$ 28 once it is set during manufacturing. However, with the addition of microcontroller 39, the value of $V_{Ref}$ 28 can be controlled from the headend. FIG. 4 also shows an digital to analog converter (D/A 42), which is well known to one skilled in the art as a way to convert a signal from its digital form to its analog form. In the case of the circuit shown in FIG. 4, the $V_{Ref}$ 28 is being prepared for use in its analog form.

Another aspect of the present invention, shown in FIG. 4, is the addition of temperature sensor 40. The temperature sensor 40 detects the internal temperature to which the ASG detector is subjected, and the microcontroller 39 translates the temperature reading into a correction to $V_{Ref}$ 28 to compensate for the temperature drift of the ASG detector 7, shown in FIG. 4. The average temperature drift of the ASG circuit is determined by measuring the error produced by a number of samples of the circuit. From this information, a correction table can be generated and stored in the microcontroller 39, which allows for correction of the average error due to temperature. One of the advantages of doing temperature correction in this manner is that if it is determined after manufacturing that a different temperature correction table more closely matches the performance of the actual circuit, this new table can be downloaded to the microcontroller 39. Furthermore, it is not only possible to compensate for known temperature drift in the ASG detector 7, but it is also possible to compensate for the known temperature drift in the gain of output amplifiers 9 and 11, shown in FIG. 1.

The embodiment of the invention shown in FIG. 4, involves control from the headend using the status monitoring system 41 as discussed above. However, some cable operators may not want to provide status monitoring in amplifier stations due to cost. An addition or alternative exemplary embodiment can accomplish many of the benefits of the present invention with a control switch 43, which is a mechanical switch or switches installed in the amplifier station. The control switch 43 is connected to the microcontroller 39 such that when the switch is thrown to the opposite position, this action is detected by the microcontroller 39 and causes the microcontroller 39 to shift the tuning of the first local oscillator 33 (or the second local oscillator 37) in order to retune the filter from the correct frequency for analog channels (52 of FIG. 3) to that for digital channels (53 of FIG. 3). It will also change the value of $V_{Ref}$ 28 to the appropriate value for a digital channel channels (53 of FIG. 3). Alternatively a series of control switches 43 can be used to permit the operator to program the detector for different channels.

Another alternative exemplary embodiment or addition of the present exemplary embodiment involves providing a computer port 44 (such as a serial port, a USB port, or an I²C port, all of which are known to those skilled in the art) to allow the operator to temporarily connect a portable computer to the station (microcontroller 39). The computer will download new set-up parameters to the microcontroller 39. The manufacturer may choose to provide this port as a convenient means to program the parameters at the factory.

Figure 5:
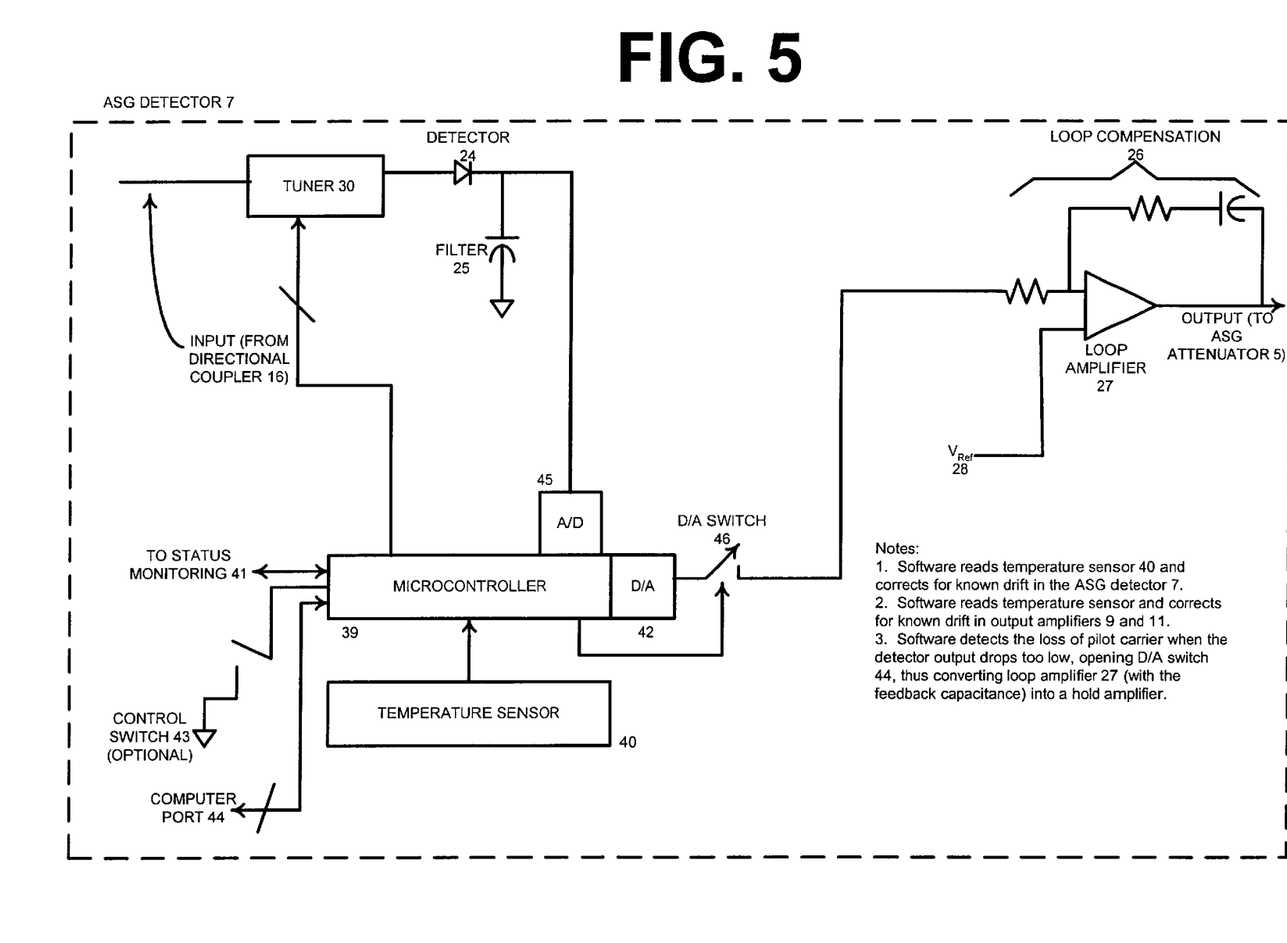
FIG. 5 is a diagram showing an ASG detector which can detect the loss of the pilot signal.

FIG. 5 is a diagram showing an ASG detector which can detect the loss of the pilot signal. In FIG. 5, the tuner 30 operates as it did in FIG. 4. That is, tuner 30 receives its tuner signal(s) from the microcontroller 39. The tuner converts the pilot signal input to an intermediate frequency and has a bandpass signal output to the detector circuit (detector 24 and filter 25). The filter 25 capacitor is charged to the level of the tuner output, as explained in FIG. 4. However, unlike FIG. 4, this output is received by the microcontroller through analog to digital converter (A/D) 45. The analog to digital converter A/D 45 output is the digital representation of the detector 24 output across filter 25. FIG. 5 also employs the digital to analog converter (D/A) 42, which is finctionally connected to the microcontroller 39 output. The digital to analog converter (D/A) 42 receives the microcontroller 39 output and changes the microcontroller 39 output to an analog representation. The D/A switch 46 is connected between the digital to analog converter (D/A) 42 output and one input of the loop amplifier 27. This configuration allows D/A switch 46 to control a holding feature employed when the pilot signal has dropped below a threshold level. The present gain of the station can be frozen, for example, by opening D/A switch 46. As was true in FIG. 4, the loop amplifier 27 is employed as a integrator and comparator. Those skilled in the art know that if the input to an integrating amplifier such as shown (capacitor C1 in the loop compensation 26 of loop amplifier 27 forms the integrator) can hold its output voltage if the input goes to a high impedance state. This is what happens when D/A switch 46 is opened. Capacitor C1 holds a charge proportional to the square of the output voltage from loop amplifier 27. If D/A switch 46 is open, this charge cannot change because a change in the charge would require current through C1. The current cannot flow because D/A switch 46 is open and loop amplifier 27 has an approximately infinite input resistance. Thus, since the charge cannot change on capacitor C1, the voltage across C1 must remain constant. Because the voltage across C1 must remain constant, the output voltage from loop amplifier 27 must remain constant, the desired results.

Thus, in operation, a method for changing the pilot signals monitored along a cable system which transports a plurality of signals may be had according to the invention. Initially, the tuner is instructed to monitor a first pilot signal via a tuning command. This first pilot signal may be either digital or analog. Subsequently, when a respective cable system decides to change the particular pilot signal to be monitored a change in the tuning command is parlayed to the tuner which receives the new tuning command. The tuner subsequently receives the new pilot signal. The new pilot signal may either be digital or analog. The respective bandpass filter utilizes a corresponding filter shape for either analog or digital depending on the signal type of the pilot signal. Additionally, in the event that the pilot signal is maintained while it changes from an analog to digital signal,; the tuner will still receive the signal strength of the pilot signal but utilize the appropriate filter shape to correspond with the new modulation type. The appropriate tuning is always selected to correspond with the pilot signal modulation type such that all references to switching between analog to digital signals and vice versa are within the scope of the invention regardless if the switch is between separate pilot signals or within the same pilot signal.

The present invention overcomes the problems described in the background by utilizing a circuit, and a method to allow flexibility in the changing of carrier frequencies that may be used in a coaxial cable feed for ASG sensing, with minimum disruption during the changing of that carrier frequency.

The preferred embodiment includes using an agile tuner to select the frequency that is used for ASG sensing (the "pilot signal"), thereby allowing a cable operator to change the pilot carrier frequency from time to time. The tuner is primarily controlled by a microprocessor which is used to download the tuner information (tuning command) into the phase-locked loops. The tuning command will control the frequency which the phase-locked loops will use to provide an adjustable frequency signal to the mixer and convert the pilot signal to an intermediate frequency. Bandpass filters provide a passband signal containing the pilot signal.

In a first exemplary embodiment of the present invention, the microcontroller is used to load the tuning command into the phase-locked loops. The microprocessor sends tuner signals to two phase-locked loops that have an adjustable frequency signal output. The first phase-locked loop has a first adjustable frequency signal output, which is sent to the mixer. The mixer also receives the incoming pilot signal. The mixer has an output of a first intermediate frequency which is the input to a first bandpass filter. The bandpass filter has an upper and lower limit of frequencies it will pass, such that its output is a passband which includes the intermediate frequency (and the pilot signal). In this exemplary embodiment, this passband is the input to a second mixer. The second mixer also receives a signal from a second phase-locked loop, whose tuning signal also came from the microcontroller. The output of the second mixer is the input to a second bandpass filter. The second bandpass filter output goes through a detector circuit and then to a loop compensation circuit.

The detector circuit provides the level of the pilot signal, represented by the amplitude of the detector output (voltage across an included filter capacitor), to a loop compensation circuit. The other input to the loop compensation circuit is a voltage reference (reference signal), which is set by the microcontroller. The reference signal represents the level that the pilot signal should maintain, if it were not subject to temperature and frequency range losses of the medium on which it travels (e.g. coaxial cable).

One skilled in the art will realize that some of the same benefits of the previous exemplary embodiment may be implemented while using only a single phase-locked loop, mixer and bandpass filter. Thus another exemplary embodiment implements a microcontroller, used to load the tuning command into the phase-locked loop. The microprocessor sends a tuner signal to the phase-locked loop. The phase-locked loop locks in on an adjustable frequency signal, based on the tuner signal, and provides that signal to the mixer. The mixer also receives the pilot signal as an input and produces an intermediate frequency output. This intermediate frequency output is received by a bandpass filter. The output of the bandpass filter is passband signal. This passband signal from the bandpass filter is the input for the detector circuit.

As previously discussed, the detector circuit provides the level of the pilot signal, represented by the amplitude of the detector output, to a loop compensation circuit. The other input to the loop compensation circuit is a reference signal, which is set by the microcontroller.

One skilled in the art will realize the temperature effects of the medium (coaxial cable) is not the only component that may effect the signals performance. The temperature of components in the compensation and detector circuitry may also effect the circuits performance. These temperature variations may be compensated for by using a microprocessor and temperature sensor taking ambient temperature measurements throughout the circuit. Temperature compensation with a temperature sensor was described above as a limitation of the existing art. In the prior art, thermal compensation of the ASG detector, if it can be accomplished at all, is crude because it is limited to matching a few points using one or more thermistors. By adding a microcontroller, it is possible to do a better job of temperature compensating the gain of the ASG detector itself. Thus two more exemplary embodiments would include a temperature sensor connected to the microprocessor. The temperature sensor measures the circuit ambient temperature and this measurement is used by the microcontroller when calculating the reference signal. The reference signal represents the level which the carrier signals on the coaxial cable should be, when not affected by temperature and/or frequency variations The temperature sensor now allows compensation for the ambient temperature and inherent fluctuations of the ASG circuitry. The loop compensation circuit (and attenuator) provides compensation for the difference in the pilot reference signal and the reference voltage, thus correcting the amplitude of the pilot signal. The correction of the pilot signal is used to correct the level of the spectrum of channels on the coaxial cable feed.

Yet, four other exemplary embodiments highlight the analog to digital and digital to analog features of the microcontroller, with the microcontroller in the feedback loop of the circuit as shown in FIG. 5. One skilled in the art will recognize the analog to digital and digital to analog function may be discrete external functions or a function internal to the microcontroller. The tuner and detector components work as described in the previously discussed embodiments. However, the output of the detector, representing the pilot signal level, is received by an analog to digital converter. After the pilot reference is transformed into its digital form, the microcontroller may be used to add established values to the output of the detector as a function of the temperature sensed by a temperature sensor and other factors. The microcontroller output is converted back to analog (either internally or by an external digital to analog converter) and sent to one input of the loop compensation network. The other input to the loop compensation circuit is a voltage reference, which no longer has to be a varying signal to compensate for known changes in gain characteristics.

The microcontroller, and various changes or additions to the circuitry, offers other features that may be implemented with the present invention. In a configuration as described in the above described exemplary embodiment (with the microcontroller in the feedback loop), the microcontroller can be programmed to detect loss of the pilot carrier by detecting a drastic reduction in the output of detector (and filter). The pilot carrier might be lost for any of several reasons: the pilot source in the headend may fail or be turned off accidentally, or the pilot (and certain other channels) might be delivered via one optical path, while other signals are delivered by an alternate path. This latter practice is becoming commonplace in advanced cable television networks having a mixture of broadcast and node-specific channels. If the path carrying the pilot fails, it is desirable to hold the gain of the amplifier station at its last known value. In existing systems, the gain of the station will increase to maximum when the pilot carrier is removed. If this happens, the remaining signals will increase in level, possibly causing distortion problems. In extreme cases, damage could result to amplifiers further down the signal path The present invention may implement a digital to analog (D/A) switch to freeze the gain of the circuit if the loss of the pilot signal is detected. The switch would be implemented such that in the closed position, operation would occur as described in the exemplary embodiment with the microcontroller in the feedback loop. If the switch is open, the loop compensation (integrator) is isolated from the microcontroller, tuner and detector circuit. The present gain of the station can be frozen, for example, by opening a D/A switch. Those skilled in the art know that if the input to an integrating amplifier can hold its output voltage if the input goes to a high impedance state. This is what happens when the switch is opened. The capacitor in the feedback loop of the integrator holds a charge proportional to the square of the output voltage from operational amplifier 27. This causes the output voltage from amplifier to remain constant, the desired results.

Of course there are other ways to implement the hold output constant function; some of which are known to those skilled in the art. A particularly useful implementation of the hold feature is to bring the functions of the loop amplifier and compensation into the microcontroller. Those skilled in the art know that the microcontroller can be programmed to perform the functions of the loop compensation, then when the input signal from the A/D converter goes away, the microcontroller can simply hold the last value until the input comes back.

Yet another aspect of the present invention, in this exemplary embodiment, allows use of dual slope AGC systems at low cost. In the days of long amplifier cascades (the 1970s and 80s), it was common practice in the cable industry to use dual slope AGC circuits rather than the single-pilot ASG systems used today. These dual slope systems employed two pilot carriers, one near the low end of the spectrum and one near the high end. Two AGC detectors measured the amplitude of both pilots and adjusted not only the gain, but also the tilt of the amplifier station to compensate for variations due to temperature. This was done to ensure that at the output of a long cascade of amplifiers, the signal was still tilted according to the designed tilt. Tilt is desirable because coaxial cable has more loss at high frequencies than at low.

In modern practice, in which the length of an amplifier cascade is limited to typically six amplifiers or less, dual slope AGC systems are not used. The shorter cascade is less sensitive to errors in tilt. Since a conventional dual slope system requires two AGC detectors, cost is higher. Nonetheless it would be desirable to use dual slope techniques if the cost can be made lower. This is possible using the instant invention similar to the way it is shown in FIG. 5.

What is claimed is:

1. An ASG system which utilizes a pilot signal and a tuner for maintaining ASG control for a system operable to transport a plurality of station signals, said ASG system comprising:

a controller operable to generate a first control signal for assigning a pilot signal based on a first station signal;

a tuner electronically coupled to said controller operable to receive said first control signal and assign a pilot signal based on said first control signal;

said controller operable to generate a second control signal for assigning a pilot signal based on a second station signal;

said tuner operable to receive said second control signal and assign a pilot signal based on said second control signal; and said tuner operable to adjust the frequency gain of said assigned pilot signal.

2. The ASG system of claim 1, wherein said tuner has a reference voltage set by said controller based on either said first or said second control signal.

3. The ASG system of claim 1, wherein said first control signal assigns a pilot signal that is a different frequency from the pilot signal assigned by said second control signal.

4. The ASG system of claim 1, wherein said tuner is operable to switch from analog parameters to digital parameters based on said second control signal.

5. The ASG system of claim 1, wherein said tuner is operable to switch from digital parameters to analog parameters based on said second control signal.

6. A method of maintaining ASG control utilizing a pilot signal and a tuner for a system operable to transport a plurality of station signals, said method comprising:

providing a first control signal from a first station signal which can be used for assigning a pilot signal;

providing a second control signal from a second station signal which can be used for assigning a pilot signal;

selecting a pilot signal utilizing said tuner;

providing a controller for instructing said tuner to select either said first or said second control signal for assigning a pilot signal for said system; and adjusting the frequency gain of said assigned pilot signal utilizing said tuner.

7. The method of claim 6, wherein said tuner has a reference voltage set by said controller based on either said first or said second control signal for adjusting the frequency gain of said assigned pilot signal.

8. The method of claim 6, wherein said second control signal assigns a pilot signal that is a different frequency from said pilot signal assigned by said first control signal.

9. The method of claim 6, wherein said tuner is operable to switch from analog parameters to digital parameters based on said second control signal.

10. The method of claim 6, wherein said tuner is operable to switch from digital parameters to analog parameters based on said second control signal.

11. An ASG system for obtaining a pilot signal for a system operable to transport a plurality of station signals, said system having a tuner utilized to adjust the frequency gain of said pilot signal, said ASG system comprising:

a controller operable to generate a first control signal for assigning a pilot signal based on a first station signal;

a tuner electronically coupled to said controller operable to receive said first control signal and set a pilot signal based on said first control signal;

said controller operable to generate a second control signal for assigning a pilot signal based on a second station signal; and said tuner operable to receive said second control signal and assign a pilot signal based on said second control signal.

12. The ASG system of claim 11, wherein said tuner has a reference voltage set by said controller based on either said first or said second control signal.

13. The ASG system of claim 11, wherein said first control signal assigns a pilot signal that is a different frequency from said pilot signal assigned by said second control signal.

14. The ASG system of claim 11, wherein said tuner is operable to switch from analog parameters to digital parameters based on said second control signal.

15. The ASG system of claim 11, wherein said tuner is operable to switch from digital parameters to analog parameters based on said second control signal.

* * * * *